US012750950B2

(12) United States Patent
Lazarus et al.

(10) Patent No.: US 12,750,950 B2
(45) Date of Patent: Sep. 29, 2026

(54) LASER FOLDED 3D ELECTRONICS

(71) Applicant: U.S. Army DEVCOM, Army Research Laboratory, Adelphi, MD (US)

(72) Inventors: Nathan S. Lazarus, Bear, DE (US); Adam L. Bachmann, Tampa, FL (US); Michael D. Dickey, Raleigh, NC (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1051 days.

(21) Appl. No.: 17/944,857

(22) Filed: Sep. 14, 2022

(65) Prior Publication Data

US 2024/0090126 A1 Mar. 14, 2024

(51) Int. Cl.
*H05K 1/02* (2006.01)
*H05K 3/00* (2006.01)

(52) U.S. Cl.
CPC ........... *H05K 1/028* (2013.01); *H05K 3/0026* (2013.01); *H05K 2201/055* (2013.01); *H05K 2203/1105* (2013.01); *H05K 2203/302* (2013.01)

(58) Field of Classification Search
CPC ................. H05K 1/028; H05K 3/0026; H05K 2201/055; H05K 2203/1105; H05K 2203/302; Y10T 29/49128; Y10T 29/49158; B23K 26/0093; B23K 26/34
See application file for complete search history.

(56) References Cited

U.S. PATENT DOCUMENTS

| | | | | |
|---|---|---|---|---|
| 4,803,695 | A * | 2/1989 | Yamamoto ................ | H01S 5/14 372/49.01 |
| 5,228,324 | A | 7/1993 | Frackiewicz et al. | |
| 5,359,872 | A | 11/1994 | Nashiki | |
| 5,712,463 | A | 1/1998 | Singh et al. | |
| 5,719,374 | A | 2/1998 | Frackiewicz et al. | |
| 6,011,239 | A | 1/2000 | Singh et al. | |
| 6,251,328 | B1 | 6/2001 | Beyer et al. | |
| 6,415,639 | B1 | 7/2002 | Killian et al. | |
| 6,622,540 | B2 | 9/2003 | Jones et al. | |
| 6,640,604 | B2 | 11/2003 | Matsushita | |
| 7,624,610 | B2 | 12/2009 | Inoue et al. | |
| 8,552,299 | B2 | 10/2013 | Rogers et al. | |
| 8,980,380 | B2 * | 3/2015 | Pique ................ | B23K 26/0093 427/554 |

(Continued)

OTHER PUBLICATIONS

A. Gisario, M. Mehrpouya, S. Venettacci, A. Mohammadzadeh, and M. Barletta, "Laser Origami (LO) of three dimensional (3D) components: Experimental analysis and numerical modelling," J. Manufacturing Processes, vol. 23, 2016, pp. 242-248.

(Continued)

*Primary Examiner* — Donghai D Nguyen
(74) *Attorney, Agent, or Firm* — Eric B. Compton

(57) ABSTRACT

A novel methodology of forming a three-dimensional electronic device according to various embodiments of the present invention is described. The methodology comprises, at least, a step of laser folding, using only a laser, a two-dimensional electrically insulating printed circuit board at least partially covered with at least one metal layer, with the laser impinging upon the at least one metal layer to make one or more folds of the printed circuit board to form a three-dimensional electronic device structure.

21 Claims, 12 Drawing Sheets

(56) References Cited

U.S. PATENT DOCUMENTS

| | | | | |
|---|---|---|---|---|
| 9,585,245 | B2 | 2/2017 | Li et al. | |
| 10,748,867 | B2 | 8/2020 | Wicker et al. | |
| 11,364,566 | B2 | 6/2022 | Lazarus et al. | |
| 2008/0041617 | A1 | 2/2008 | Chen et al. | |
| 2012/0285937 | A1* | 11/2012 | Birnbaum | B23K 26/34 219/121.85 |
| 2020/0276672 | A1 | 9/2020 | Lazarus et al. | |

OTHER PUBLICATIONS

J. D. Majumdar and I. Manna, "Laser material processing," Int. Materials Reviews, 2011, vol. 56, pp. 341-388.
N. Lazarus, S. S. Bedair, and G. L. Smith, "Origami Inductors: Rapid Folding of 3-D Coils on a Laser Cutter" IEEE Electron Device Letters, 39, 7, 2018, pp. 1046-1049.
E. Macdonald, R. Salas, D. Espalin, M. Perez, E. Aguilera, D. Muse, R. B. Wicker, "3D printing for the rapid prototyping of structural electronics" IEEE Access, 2, 2014, pp. 234-242.
Joe Lopes, A., MacDonald, E. and Wicker, R.B. (2012), "Integrating stereolithography and direct print technologies for 3D structural electronics fabrication", Rapid Prototyping Journal, 2012.
Siegel, A.C., Phillips, S.T., Dickey, M.D., Lu, N., Suo, Z. and Whitesides, G.M., "Foldable Printed Circuit Boards on Paper Substrates" Adv. Funct. Mater. 2010, 20, 28-35.
Li, Y., Liu, W., Deng, Y. et al. "Miura-ori enabled stretchable circuit boards." npj Flex Electron (2021) 3.
Sterman, Y., Demaine, E. D., and Oxman, N. (Oct. 8, 2013). "PCB Origami: A Material-Based Design Approach to Computer-Aided Foldable Electronic Devices." ASME. J. Mech. Des. 2013.
G. J. Hayes, Y. Liu, J. Genzer, G. Lazzi, and M. D. Dickey "Self-Folding Origami Microstrip Antennas" IEEE Trans. Antennas Propag 2014.
A. de Leon, A. C. Barnes, P. Thomas, J. O'Donnell, C. A. Zorman, and R. C. Advincula "Transfer Printing of Self-Folding Polymer-Metal Bilayer Particles" ACS Appl. Mater. Interfaces 2014.
K. Kalaitzidou, and A. J. Crosby "Adaptive Polymer Particles" Appl. Phys. Lett. 2008.
H. Shen, Z. Yao, and J. Hu "An analytical model for bending angle in metal/ceramic bilayer system of laser forming" J. App. Phys. 2008.
H. Shen, Z. Yao, and J. Hu "Numerical analysis of metal/ceramic bilayer materials systems in laser forming" Comput. Mater. Sci. 2009.
M. Riahi, M. Hoseinpour Gollo, and S. Nader Ameli Kalkhoran "Study of the effect of Guassian and Uniform heat flux on laser forming of Bi-layer sheets" Mech. Ind. 2015.
N. Li, L. Gao, Z. Z. Yi, F. R. Zhai, and K. Shan. "Temperature Field Simulation of TC4/SiC Bilayer in Laser Forming." Solid State Phenomena 2018.
S. P. Edwardson, G. Dearden, P. French, K. G. Watkins, and W. J. Cantwell, "Laser Forming of Fiber Metal Laminates" Lasers in Eng. 2005.
Bucher, T., Cardenas, S., Verma, R., Li, W., and Lawrence Yao, Y. "Laser Forming of Sandwich Panels With Metal Foam Cores." ASME. J. Manuf. Sci. Eng. 2018.
S. M. H. Seyedkashi, H. D. Abazari, M. Hoseinpour Gollo, Y. Y. Woo, and Y. H. Moon, "Characterization of laser pending of SUS304L/C11000 clad sheets" J. Mech. Sci. Technol. 2019.
Z. Li, X. Wang, and Y. Luo "Equivalent Properties of Transition Layer Based on Element Distribution in Laser Bending of 304 Stainless Steel/Q235 Carbon Steel Laminated Plate" Materials 2018.
M. Kotobi, and M. Honarpisheh "Through-depth residual stress measurement of laser bent steel-titanium bimetal sheets" J. Strain Anal. Eng. 2018.
M. Kotobi, H. Mansouri, and M. Honarpisheh "Investigation of laser bending parameters on the residual stress and pending angle of St-Ti bimetal using FEM and neural network" Opt. Laser Technol. 2019.
S. M. H. Seyedkashi, M. Hoseinpour Gollo, J. Biao, and Y. H. Moon "Laser bendability of SUS430/C11000/SUS430 laminated composite and its constituent layers" Met. Mater. Int. 2016.
L. Baufay, F. A. Houle, and R. J. Wilson "Optical self-regulation during laser-induced oxidation of copper" J. Appl. Phys. 61, 4640 (1987).
H. Kwon, J. Kim, K. Ko, M. J. Matthews, J. Suh, H.-J. Kwon, and J.-H. Yoo, "Laser-induced digital oxidation for copper-based flexible photodetectors" Appl. Surf. Sci. 540 (2021) 148333.
G. Tang, A. C. Hourd, and A. Abdolvand "Nanosecond pulsed laser blackening of copper" Appl. Phys. Lett. 101, 231902 (2012).
O. Benavides, O. Lebedeva, and V. Golikov "Reflection of nanosecond Nd:YAG laser pulses in ablation of metals" Opt. Express 19, 21842-21848 (2011).
S. P. Murzin, G. Liedl, and R. Pospichal "Coloration of a copper surface by nanostructuring with femtosecond laser pulses" Opt. Laser. Technol. 119 (2019) 105574.
M. von Allmen, P. Blaser, K. Affolter, and E. Strumer "Absorption Phenomena in Metal Drilling with Nd-Lasers" IEEE J. Quantum Electron. QE-14, 2, 1978.
I. Ursu, L. C. Nistor, V. S. Teodorescu, I. N. Mihailescu, L. Nanu, A. M. Prokhorov, N. I. Chapliev, and V. I. Konov "Early oxidation stage of copper during cw CO2 laser irradiation" Appl. Phys. Lett. 44, 188 (1984).
I. Ursu, L. C. Nistor, V. S. Teodorescu, I. N. Mihailescu, I. Apostol, L. Nanu, A. M. Prokhorov, N. I. Chapliev, V. I. Konov, V. N. Tokarev, and V. G. Ralchenko "Continuous wave laser oxidation of copper" Proc. SPIE 0398 1983.
G. Daurelio "Cutting Copper Sheets Using CO2 Lasers" Hyperfine Interact. 37 (1987) 385-414 (Abstract only).
G. Daurelio and G. Giorleo "Experimental Techniques to Cut and Weld Copper by Laser—a Review" Mater. Manuf. Process. 6(4):577-603 (1991) (Abstract only).
M. I. Arzuov, M. E. Karasev, V. I. Konov, V. V. Kostin, S. M. Metev, A. S. Silenok, and N. I. Chapliev "Investigation of the absorption coefficient of metal targets irradiated by pulse-periodic CO2 laser radiation in air" 1978 Sov. J. Quantum Electron. 8 892.
M. Musztyfaga-Staszuk, D. Janicki, K. Gawlińska-Nęcek, R. Socha, G. Putynkowski, and P. Panek "Copper Oxides on a Cu Sheet Substrate Made by Laser Technique" Materials 13(17):3794 (2020).
Adam L, Bachmann et al., "Making Light Work of Metal Bending: Laser Forming in Rapid Prototyping," Quantum Beam Sci. (2020), 4(4), 44.
Adam L. Bachmann, Brendan Hanrahan, Michael D. Dickey, and Nathan Lazarus, Presentation titled "Self-folding PCB Origami: Rapid Prototyping of 3D Electronics via Laser Forming," given at the North Carolina State University Engineering Department's Graduate Research Symposium on Tuesday, Sep. 28, 2021.
Adam L. Bachmann, Brendan Hanrahan, Michael D. Dickey, and Nathan Lazarus, "Self-Folding PCB Kirigami: Rapid Prototyping of 3D Electronics via Laser Cutting and Forming," ACS Appl. Mater. Interfaces 2022, 14, 12, 14774-14782 (Publication Date: Mar. 17, 2022), available at: https://pubs.acs.org/doi/10.1021/acsami.2c01027 (includes supplemental material).

* cited by examiner

FIG. 1 (*Background Art*)

LASER FOLDED 3D ELECTRONICS

GOVERNMENT INTEREST

The invention described herein may be manufactured, used and licensed by or for the U.S. Government without the payment of royalties thereon.

Some of the research underlying the invention was supported by the U.S. Combat Capabilities Development Command Army Research Laboratory (ARL) under Cooperative Agreement Number W911NF-20-2-0243.

BACKGROUND OF THE INVENTION

Field

Embodiments of the present invention are generally directed to electronic device manufacturing, and more particularly to, laser folded 3D electronics.

Description of Related Art

Most patterning techniques for electronic devices are limited to planar substrates, but this results in large areal footprints. Manual folding techniques allow planar substrates to be transformed into three-dimensional structures. Some self-folding technologies have been developed, but they require expensive, special equipment. Improvements are desired.

BRIEF SUMMARY OF THE INVENTION

Embodiments of the present invention are directed to fabricating three-dimensional electronics from two-dimensional printed circuit boards. For example, according to various embodiments, a method of forming a three-dimensional electronic device includes, at least a step of laser folding, using only a laser, a two-dimensional electrically insulating printed circuit board at least partially covered with at least one metal layer, with the laser impinging upon the at least one metal layer to make one or more folds of the printed circuit board to form a three-dimensional electronic device structure.

The laser folding included, using a laser, to execute one or more upward folds via a temperature gradient mechanism of the printed circuit board and/or one or more downward folds via a buckling mechanism of the printed circuit board.

The printed circuit board may include electrical circuit patterning and/or electrical circuit components thereon. To those ends, the method may further include forming electrical circuit patterning on the printed circuit board from the at least one metal layer prior to laser folding, and/or attaching or forming electrical components on the printed circuit board prior to laser folding. At a minimum, the at least one metal layer can extend substantially over a surface of the printed circuit board in a region it is to be folded.

The printed circuit board can be formed of various materials, including those of a polymer, plastic, rubber, ceramic, or fiberglass. Exemplary polymer materials may include polyimide, polyester, polyethylene naphthalate, polytetrafluoroethylene, aramid, or epoxy, for instance. And the at least one metal layer may include comprises copper, aluminum, nickel, gold, or silver, as non-limiting examples.

The method may further include laser cutting, using the laser, the printed circuit board at least partially covered with the at least one metal layer before and/or after the laser folding. Additionally, the method may include reducing the reflectivity of the surface of the at least one metal layer to the laser light for folding. In some embodiments, the step of reducing the reflectivity may include applying a coating to the surface of the at least one metal layer to reduce the reflectivity of the laser light for folding. Such a coating may be a graphite or ENIG coating, for example.

In other embodiments, no light absorbing coating is applied or required for the laser folding. Rather, the step of reducing the reflectivity may include oxidizing the surface of the metal layer or laser roughening the surface of the at least one metal layer to reduce the reflectivity of the laser light for laser folding. These steps may be achieved using a laser.

In one particular embodiment, the method of laser forming a three-dimensional electronic device includes: providing a two-dimensional electrically insulating printed circuit board at least partially covered with at least one metal layer; reducing the reflectivity of the surface of the at least one metal layer to the laser light for laser folding; and laser folding, using only a laser, the two-dimensional printed circuit board at least partially covered with the at least one metal layer, the laser impinging upon the at least one metal layer to make one or more folds of the printed circuit board to form a three-dimensional electronic device structure.

According to further embodiments, an apparatus for forming a three-dimensional electronic device may include: a clamp fixture to secure a two-dimensional electrically insulating printed circuit board at least partially covered with at least one metal layer; and at least one laser configured to: (i) reduce the reflectivity of the surface of the at least one metal layer to reduce the reflectivity of the laser light for laser folding; (ii) laser cut fold a two-dimensional printed circuit board at least partially covered with the at least one metal layer; and (iii) laser fold the two-dimensional printed circuit board at least partially covered with the at least one metal layer, the laser impinging upon the at least one metal layer to form a three-dimensional electronic device structure.

Preferably, the at least one laser comprises a single laser which can operate in different power modes for performing steps (i), (ii) and (iii). Although, multiple lasers could also be provided to perform the same steps. The apparatus may further include equipment configured to: (iv) form electrical circuit patterning on the printed circuit board from the at least one metal layer prior to laser folding, and/or (v) attach electrical components on the printed circuit board prior to laser folding.

These and other embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

FIG. 9A shows a template to form the cube circuit from a 2D PCB. FIG. 9B shows step-by-step laser folding of the cube circuit. FIG. 9C is a photograph showing the 3D cube circuit after its fabrication.

DETAILED DESCRIPTION

We disclose a novel methodology for laser forming, i.e., localized heating with a laser to induce plastic deformation, 2D printed circuit boards (PCBs) into 3D structures with electronic function. We call this laser-induced deformation "laser folding." This methodology can form complex, multifold structures with integrated electronics. Laser forming to add a third dimension to printed circuit boards is an important technology to enable the rapid fabrication of complex 3D electronics.

Figure 1:
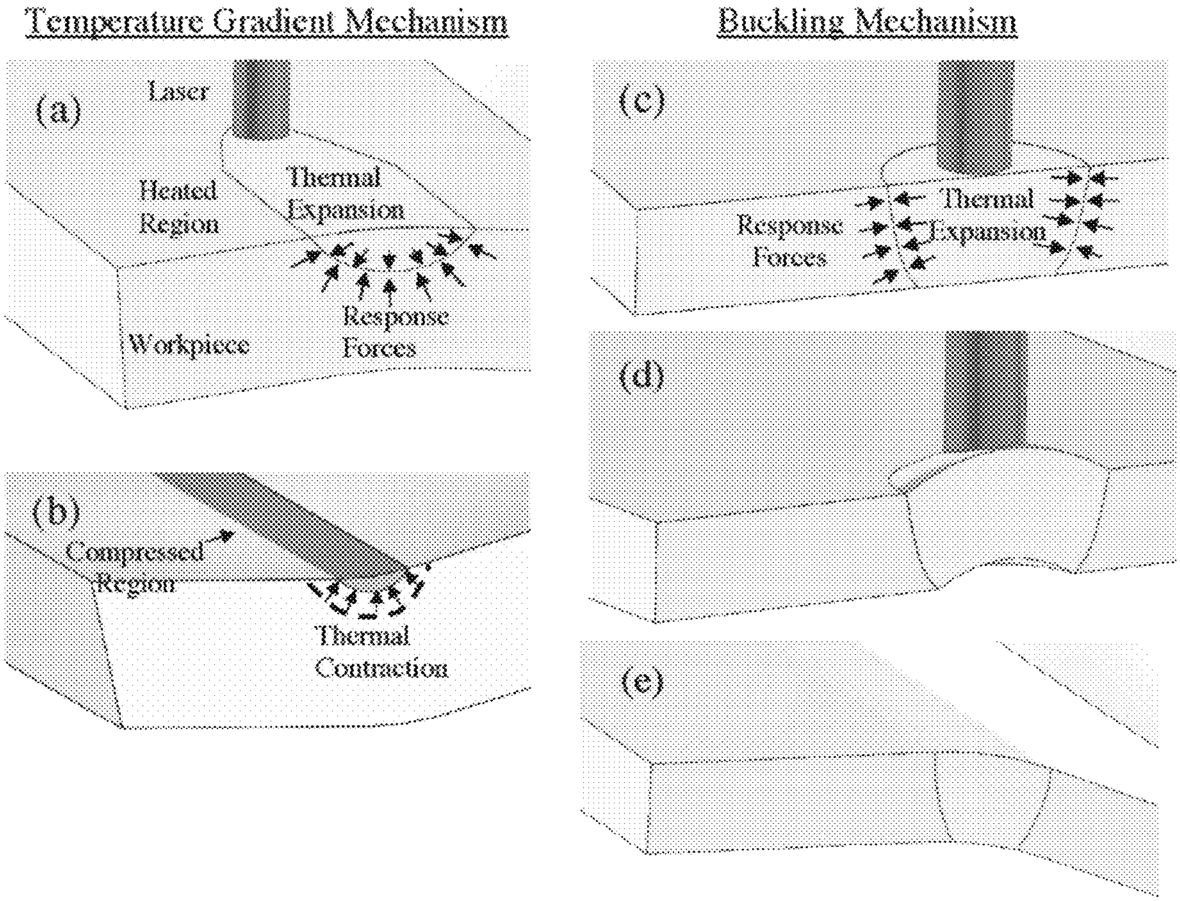
FIGS. 1(*a*)-1(*e*) show background laser folding.

Laser folding is a fabrication methodology to form complex 3D parts from 2D material. The technique is described, for instance, in U.S. Pat. No. 11,364,566 titled "Complex Laser Folding and Fabrication," herein incorporated by reference in its entirety. It can be performed in ambient conditions and works at multiple length scales. FIGS. 1(*a*)-1(*e*), reproduced from that patent, show the general process. In brief, a laser triggers rapid temperature changes and resulting thermal stresses in a workpiece, causing permanent plastic deformation. The folding here uses two types of laser forming known as the temperature gradient mechanism (TGM) and buckling mechanism (BM), respectively. For TGM-based forming, the laser is scanned rapidly to heat the surface while not allowing time for the heat to spread vertically through the workpiece. The surface expands while the rest of the piece does not, resulting in bending away from the laser, a phenomenon known as counter bending. However, the cooler surroundings act to constrain this expansion, resulting in the buildup of plastic compressive stresses (FIG. 1(*a*)). As the region cools, contraction occurs (FIG. 1(*b*)) and the shape bends back. The final contraction during cooling is the dominant effect, and therefore the final bending direction for TGM is always toward the laser beam.

For the buckling mechanism, the laser is scanned more slowly so heat propagates through the thickness of the sheet resulting in a lateral temperature gradient (FIG. 1(*c*)). The heated region attempts to expand laterally but is again constrained, resulting in a buildup of compressive stresses. Once these stresses reach a threshold, an instability develops and the heated area buckles (FIG. 1(*d*)). As the laser travels across the fold, the buckle propagates across the surface resulting in bending, in the illustrated case away from the laser (FIG. 1(*e*)). In the absence of other constraints, the laser exposed region is capable of buckling toward or away from the laser based on other factors such as orientation, residual stresses, or an applied force. Using a substrate that has been held in a roll, or otherwise conditioned to favor bending downward, and biasing it flat during the manufacturing process, assures that the BM bend is downward. Conditioning the substrate to bend in two dimensions, such as along axis x and along axis y (which can be orthogonal), increases the axes along which BM bends downwards.

We initially believed laser folding is material agnostic. It has been successful employed to produce complex shapes from metals such as steel plates, nickel foils, and copper. The technique has also been demonstrated with non-metals such as silicon, borosilicate glass, and certain polymers. However, we have found that many metals are too reflective for the impinging laser light. For an in-depth study, see, e.g., Adam L, Bachmann et al., "Making Light Work of Metal Bending: Laser Forming in Rapid Prototyping," Quantum Beam Sci. (2020), 4(4), 44, herein incorporated by reference in its entirety (in particular, FIG. 6). As a commonly used electrically conductive metal, copper has a very reflectance of 0.95 or above for wavelengths of light above about 1000 nm. Additionally, we believe that it is difficult to produce sharp folds or bends in stressed elastomer layers used to bend PCBs. We thus sought an improved self-folding technique for PCBs.

We now describe our novel methodology of forming a three-dimensional electronic device according to various embodiments of the present invention. The methodology comprises, at least, a step of laser folding, using only a laser, a two-dimensional printed circuit board at least partially covered with at least one metal layer, the laser impinging upon the at least one metal layer to make one or more folds of the printed circuit board to form a three-dimensional electronic device structure. This novel technology enables the laser folding of three-dimensional electronics such as antennas, sensors, solar cells, and even power devices like batteries, fuel cells, and thermoelectric generators.

Figure 2:
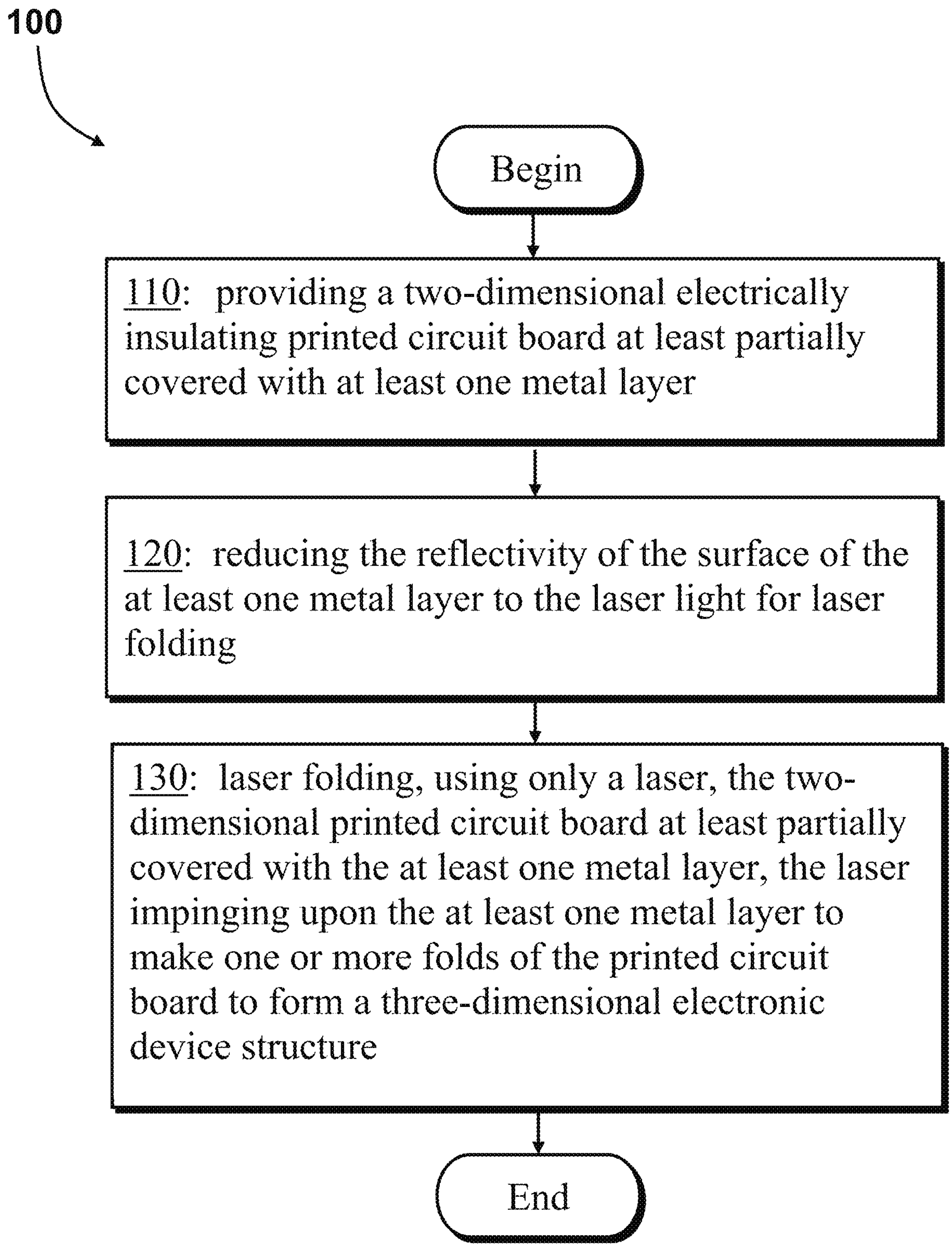
FIGS. 2, 2A and 2B depict methods of laser forming a three-dimensional electronic device according to embodiments.

FIG. 2 depicts one exemplary method 100 of laser forming a three-dimensional electronic device according to an embodiment. The method 100 comprises step 110: providing a two-dimensional electrically insulating printed circuit board at least partially covered with at least one metal layer; step 120: reducing the reflectivity of the surface of the at least one metal layer to the laser light for laser folding; and step 130: laser folding, using only a laser, the two-dimensional printed circuit board at least partially covered with the at least one metal layer, the laser impinging upon the at least one metal layer to make one or more folds of the printed circuit board to form a three-dimensional electronic device structure. These steps are discussed in more detail below.

Figure 3A:
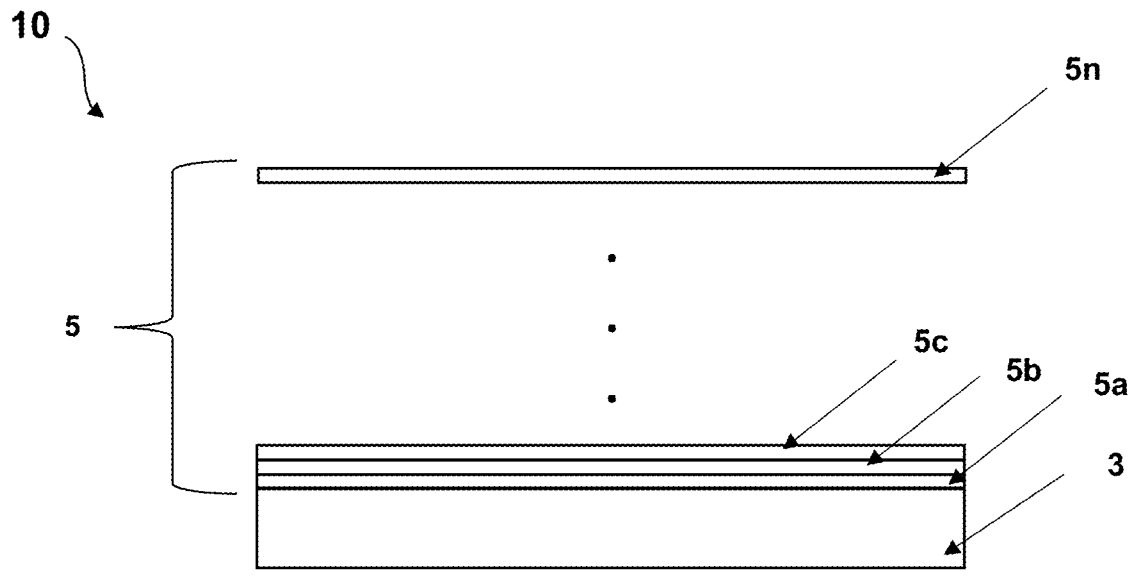
FIGS. 3A and 3B show examples of two-dimensional printed circuit boards at least partially covered with at least one metal layer.
Figure 3B:
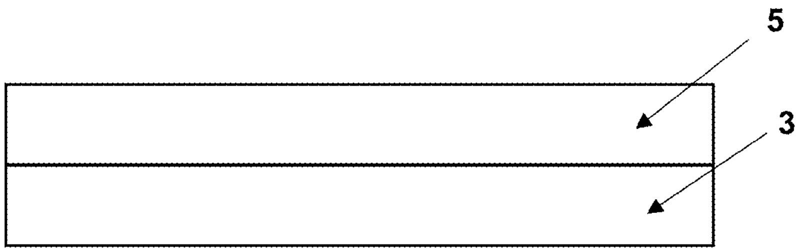

In step 110 of the method 100, and with further reference to FIGS. 3A and 3B, a two-dimensional electrically insulating printed circuit board 10 at least partially covered with at least one metal layer is provided, received, and/or fabricated (these steps all being considered "providing" for this step of method 100). The 2D printed circuit board 10 could be stock material or specifically fabricated for or in practicing method 100. As shown in FIG. 3A, the printed circuit board 10 is formed of an electrically insulating material 3 and at least one metal layer 5.

The electrically insulating material 3 can be a polymer, plastic, rubber, ceramic, or fiberglass material, as non-limiting examples. What matters is that it is not electrically conductive. Preferably, it is a dielectric material suitable as an electronic circuit substrate. The electrically insulating material 3 can comprise polyimide (PI), polyester (PET), polyethylene naphthalate (PEN), polytetrafluoroethylene (PTFE), aramid, epoxy, or any combination, multi-layer, or laminate structure thereof, as non-limiting examples. For instance, FR4 is a common PCB material formed of an epoxy laminate which may be used.

The at least one metal layer 5 is an electrically conducive material. Said layer(s) may be formed of copper, aluminum, nickel, gold, silver, or alloys thereof, as non-limiting examples. The at least one metal layer 5 can comprise any number of metal layers 5*a*, 5*b*, 5*c* . . . 5*n*. Many commercially available PCBs have 2, 4, 8 or even more metal layers. Additionally, the 2D PCB 10 may include electrical circuit patterning and/or electrical circuit components formed thereof. The patterning may make used of any of number of metal layers 5*a*, 5*b*, 5*c* . . . 5*n*, as typical for PCBs. The electrically insulating material 3 may be approximately 10 μm to 1-2 mm, and individual metal layers (e.g., 5*a*, 5*b*, 5*c* . . . 5*n*) may be approximately 10-150 μm, as non-limiting examples. Merely for simplicity and ease of explanation, a PCB having only a single metal layer 5 is depicted in FIG. 3B and used for PCB 10 in subsequent figures.

For instance, the methodology may be used to fold a two layered conventional flex PCB known as a "bilayer." One such bilayer is PyraluxAC354500EV from DuPont which is a single-sided laminate of 35 μm electrodeposited copper on 45 μm polyimide. Depending on the materials of the electrically insulating material 3 and the at one metal layer 5 and/or their thickness, the PCB may have a certain degree of flexibility. Flexible PCBs are common in the art and known as "flex PCBs" and can be used in practicing method 100.

While the at least one metal layer 5 could extend over the entire surface of the electrically insulating material 3 in some embodiments, this requires a lot of additional and unneeded metal. Thus, the at least one metal layer 5 needs only to extend substantially over a surface of the electrically insulating material 3 in a region of the printed circuit board 10 is to be folded.

FIGS. 3A and 3B shows the at least one metal layer 5 located on the top surface of the electrically insulating material 3. However, it will be appreciated that in some embodiments, one or more additional metal layers (not shown) may be provided on the bottom surface of the electrically insulating material 3.

Figure 4A:
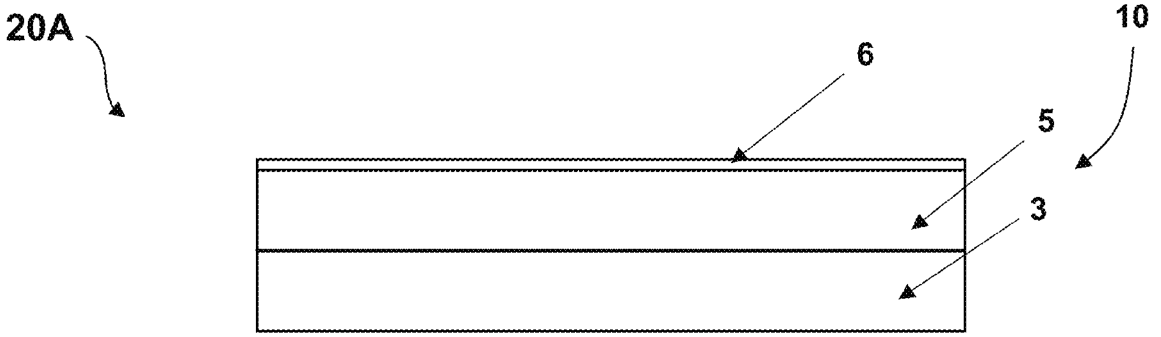
FIGS. 4A to 4C show different techniques to reduce the reflectivity of the surface of the at least one metal layer to the laser light for laser folding.
Figure 4B:
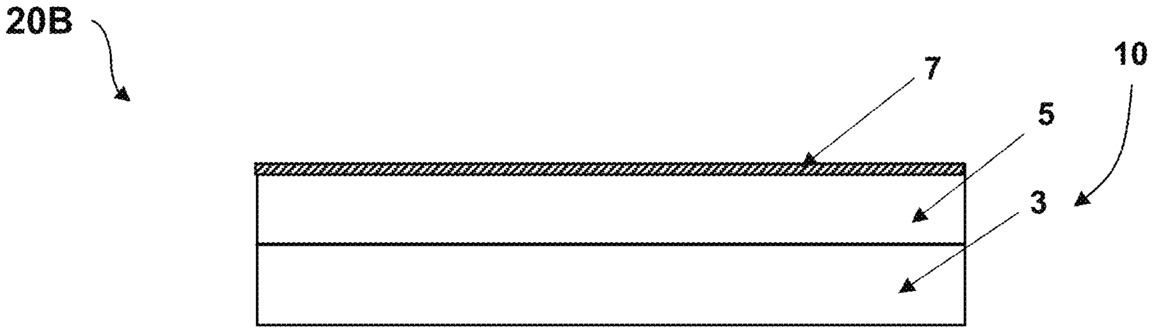
Figure 4C:
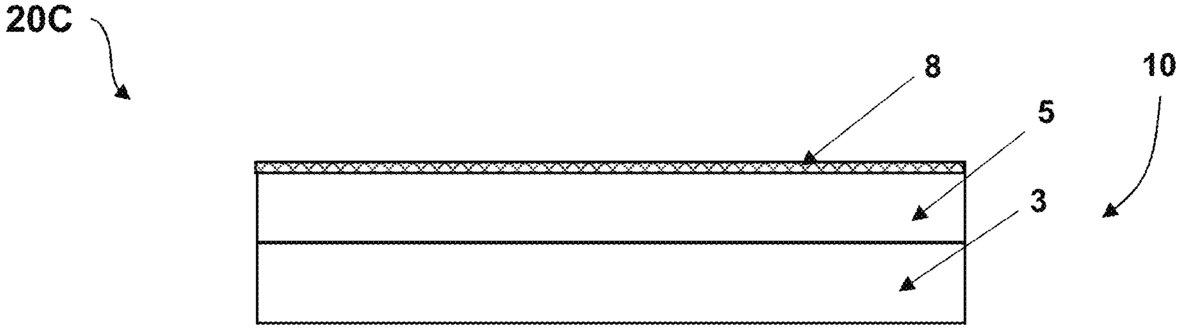

In step 120 of the method 100 depicted in FIG. 2, and with further reference to FIGS. 4A to 4C, the reflectivity of the surface of the at least one metal layer to the laser light for laser folding is reduced, as may be needed. The laser light may be in the ultraviolet (UV), visible, and/or infrared (IR) wavelength regions of the EM spectrum, for example. Again, we have found that many metals are too reflective for the wavelength of the impinging laser light. As an initial point, we note that reflectivity may be a non-issue when laser forming metals with shorter wavelength lasers as metals tend to be less reflective to shorter wavelengths. For instance, visible (532 nm) and UV (355 nm) lasers can be used for processing copper in this way. But, because of the nonlinear optical elements needed, lasers are expensive compared to fiber lasers of a comparable power which operate a higher wavelength (e.g., >600 nm) where reflectivity is significant. Thus, this poses a challenge for which we present several solutions.

FIG. 4A shows a light-absorbing coating 6 applied to the top surface of the at least one metal layer 5. The coating 6 increases absorption and reduces the reflectivity of the top surface of at least one metal layer 5 to the laser light for folding. For instance, the coating 6 may be a spray-on graphite coating or thin metal coating, such as an electroless nickel immersion gold (ENIG) coating, which do not reflect at higher wavelengths (e.g., >600 nm) of the laser light. The coating 6 could be 10-100 nm, or possible thicker, say in the micrometer range, as non-limiting examples, to reduce reflectivity and increase light absorption. Unfortunately, a graphite or metal coating 6 can could cause electrical problems (e.g., shorts) in electrical circuits. Thus, it may have to be later removed. The steps of depositing the light-absorbing coating 6 and perhaps, later removing it, can add to additional processing.

Other solutions do not involve applying a separate absorbing coating but affecting the surface directly. As next shown in FIG. 4B, an oxidized surface 7 can be formed on the top surface of the at least one metal layer 5 to reduce the reflectivity of the top surface of the at least one metal layer 5 to the laser light for folding. The thickness of the oxidized surface 7 could range from about 100 nm up to several micrometers, as non-limiting examples. For instance, a laser can be used to do so. In this case, a high power laser heats the surface in regular/ordinary air or another oxygen containing atmosphere sufficient to form the oxidized surface 7. The surface oxidation drastically improves absorbance of the laser light. This increased absorbance allows lower powers to be used for laser folding. In the case where the top surface of the at least one metal layer 5 initially comprises copper, the oxidized surface 7 comprises copper oxide believed to be either $Cu_2O$, CuO, or a combination thereof. $Cu_2O$ has a reflectivity ~23% while CuO has a reflectivity ~21% compared to the 98% reflectivity of bare copper for wavelengths of light above about 1000 nm.

In an alternative solution, as shown in FIG. 4C, a roughen surface 8 can be formed on the top surface of the at least one metal layer 5 to reduce the reflectivity of the top surface of the at least one metal layer 5 to the laser light for folding. For example, a high-power laser can be used to from micro-sized valleys which roughen the top surface across the region. This roughening removes a small amount of material; but this is believed to be minimal thus allowing the PCB to still fold while maintaining electrical connectivity. The roughen surface 8 help trap/absorb light. The laser can be randomly scanned to this end to create a diffusely reflecting surface. The thickness/size range of micro-valleys in the roughen surface 8 depend on the wavelength and spot size of the laser used; they can range from several hundred nm to a few micrometers, for instance.

Figure 5A:
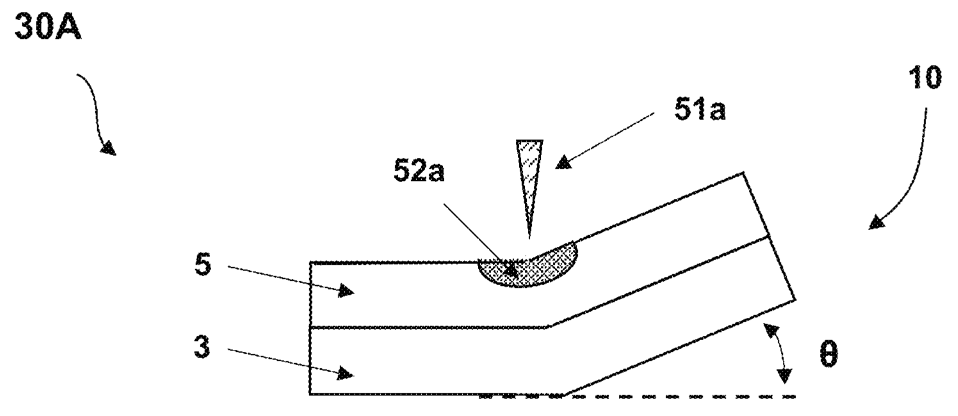
FIGS. 5A and 5B shows upward and downward laser folds of the printed circuit board made by laser folding.
Figure 5B:
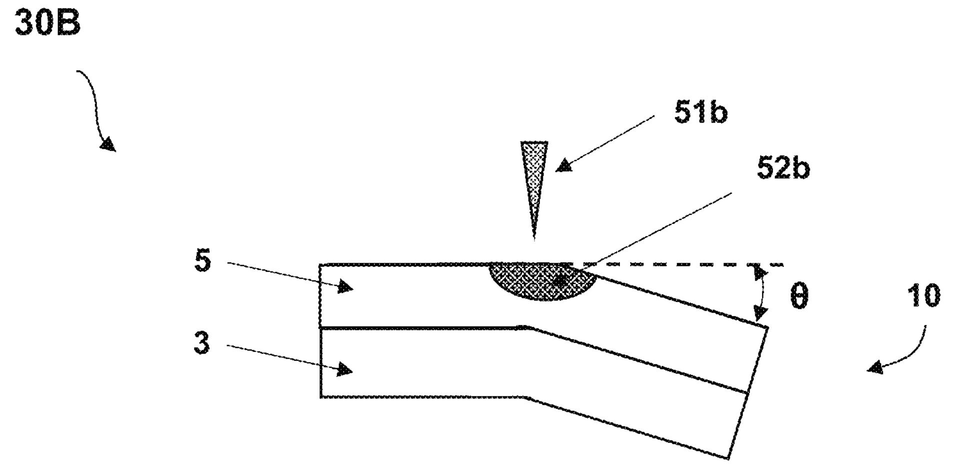

Continuing to step 130 of the method 100 depicted in FIG. 2, and with further reference to FIGS. 5A and 5B, the laser folding commences. More particular, by using only a laser, the two-dimensional electrically insulating printed circuit board 10 at least partially covered with the at least one metal layer is laser folded. That is, the laser impinges upon the at least one metal layer to make one or more folds of the printed circuit board to form a three-dimensional electronic device structure. The laser folds can be upward or downward.

There are three main mechanisms for laser forming: the temperature gradient mechanism (TGM), the buckling mechanism (BM), and the upsetting mechanism (UM). Only the TGM and BM can produce out-of-plane bending or folding, which we use for laser folding. While the terms bending and folding are often used interchangeably, folding is a highly localized shape transformation unlike bending which is more distributed, generally over length scales larger than the material thickness. The dominant mechanism depends on how the thermal gradients are established.

FIG. 5A shows an upward laser fold 30A of the printed circuit board made by laser folding. This process follows the temperature gradient mechanism (TGM) as was explained with respect to U.S. Pat. No. 11,364,566 in FIGS. 1(*a*)-1(*b*). Here, a laser beam 51*a* triggers rapid temperature changes and resulting thermal stresses in a workpiece, causing permanent plastic deformation 52*a* in the top surface of the at least one metal layer 5.

TGM relies on a steep thermal gradient through the thickness of the material and results in folding toward the laser. The steep thermal gradient between the lased and unlased side is realized with moderate laser powers and a high scan speed. This thermal gradient causes the top layer(s) to expand more than the bottom layer(s) resulting in an initial bend away from the laser called the counter bend. This expansion, however, is resisted by the surrounding, cooler metal. At the elevated temperatures during the laser pulse, the mechanical properties change dramatically, most notably the yield stress and the flow stress decrease. The stresses generated by the thermal expansion are sufficient to overcome the reduced yield stress and enter the plastic regime. Once in the plastic regime, the thermal stresses continue to generate plastic deformation when the flow stress is exceeded in the heated region. Once the laser has passed, the substrate begins to cool and the heated sections return to their original sizes, but the compressive stresses remain from the plastically deformed region. These stresses act on the scanned region, compressing it and causing the workpiece to fold toward the laser by an incremental folding angle, θ. Single passes lead to small fold angles, but larger angles are possible through repeated laser passes.

Whereas the method steps depicted in FIGS. 1(*a*)-1(*e*) laser folded the single material layer, the TGM laser folding of the top surface of the at least one metal layer 5 is sufficient to provide a bending force to bend the printed circuit board 10. Indeed, we conducted weighted testing and conclude that the laser folding of the at least one metal layer 5 can readily bend additional weight. See our 2022 *ACS Appl. Mater. Interfaces* paper, noted below. Indeed, using a thin bilayer substrate (i.e., approximately 80 μm), we were above to laser fold PCB samples to nearly 900 even with an attached weight of about 0.7 g. This is much greater than the average weight of common surface mount components, that is, around 77 mg for SOIC-8 packages. We extend this to the electrically insulating material 3 and thus the entire PCB 10.

Flex PCBs can come in a variety of metal (e.g., copper) and polymer (e.g., polyimide) layer thicknesses and the laser formability of these different bilayers is impacted by the thickness of each layer as well as the ratio of their thicknesses. Materials resist bending and folding from their flexural rigidity which is given as:

$$\text{Flexural stiffness} = Ebh^3 / 12 \quad (1)$$

where E is the Young's Modulus, and b and h are the width and thickness of the layer, respectively.

As an example, copper is a much stiffer material (E=130 GPa) compared to polyimide (E~3 GPa). So for comparable thickness ratios, the forces generated during laser forming that can fold the copper are more than sufficient for folding the polyimide layer. Because the stiffness scales as $h^3$, polyimide layers substantially thicker than the copper layer could inhibit laser forming entirely and should be taken into account. We have found that the low-power laser folding causes no noticeable changes to the metal (copper) surface.

FIG. 5B shows a downward fold 30B of the printed circuit board made by laser folding. This process follows the buckling mechanism (BM) as was explained with respect to U.S. Pat. No. 11,364,566 in FIGS. 1(*c*)-1(*e*). For the buckling mechanism, the laser beam 51*b* is scanned more slowly so heat propagates through the thickness of the sheet resulting in a lateral temperature gradient. The heated region 52*b* attempts to expand laterally but is again constrained, resulting in a buildup of compressive stresses. Once these stresses reach a threshold, an instability develops and the heated area buckles. As the laser travels across the fold, the buckle propagates across the surface resulting in bending, in the illustrated case away from the laser. In the absence of other constraints, the laser exposed region is capable of buckling toward or away from the laser based on other factors such as orientation, residual stresses, or an applied force. Using a substrate that has been held in a roll, or otherwise conditioned to favor bending downward, and biasing it flat during the manufacturing process, assures that the BM bend is downward. Conditioning the substrate to bend in two dimensions, such as along axis x and along axis y (which can be orthogonal), increases the axes along which BM bends downwards.

Figure 5C:
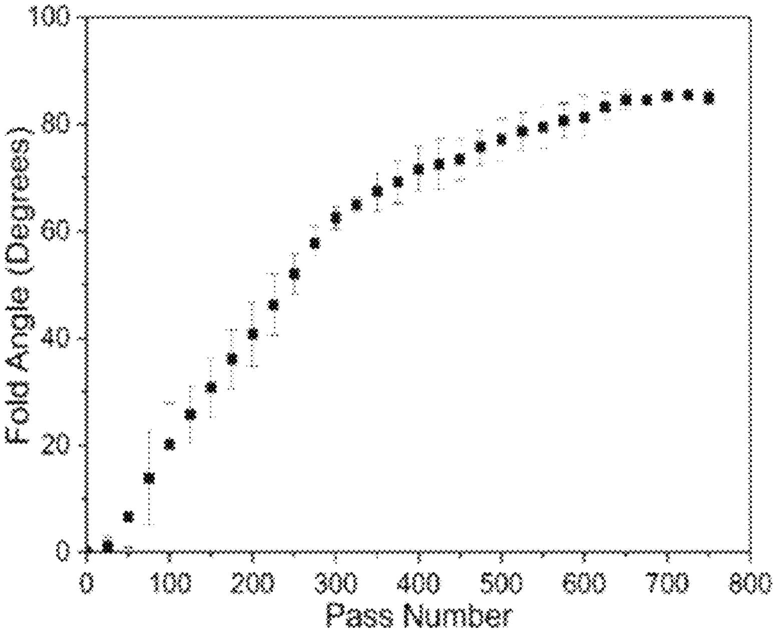
FIG. 5C shows the relationship between the number of laser passes for temperature gradient mechanism folding and the resultant fold angle, θ (in degrees), based on our acquired data.

FIG. 5C shows the relationship between the number of laser passes for TGM folding and the resultant fold angle, θ (in degrees), based on our acquired data. The plotted data show a generally linear relationship up to about 300 laser passes. Afterwards, the slope decreases and tappers off as it approaches verticality (90°). Near 90°, the folded substrate begins to interfere with the focusing path of the laser beam and folding stops. This self-limiting behavior of the TGM serves as a natural control mechanism for preparing samples with right angle folds.

We note that the laser can be re-oriented with respect to the workpiece to increase the fold angle (e.g., >90°). Or, as was similarly disclosed in U.S. Pat. No. 11,364,566, a reflector element may be formed from the at least one metal layer 5 of the printed circuit board 10. The reflector can re-direct the focused laser beam using the reflector to cut, etch or fold portions that would otherwise be inaccessible to the focused laser beam from a fixed laser direction.

It is further noted that we have also demonstrated BM folding in a number of other materials and believe it should be achievable for metal coated PCBs. Like the TGM response, we believe that BM folding should be able to fold a degree to a few degrees per pass once an applicable laser scanning speed is determined.

Figure 2A:
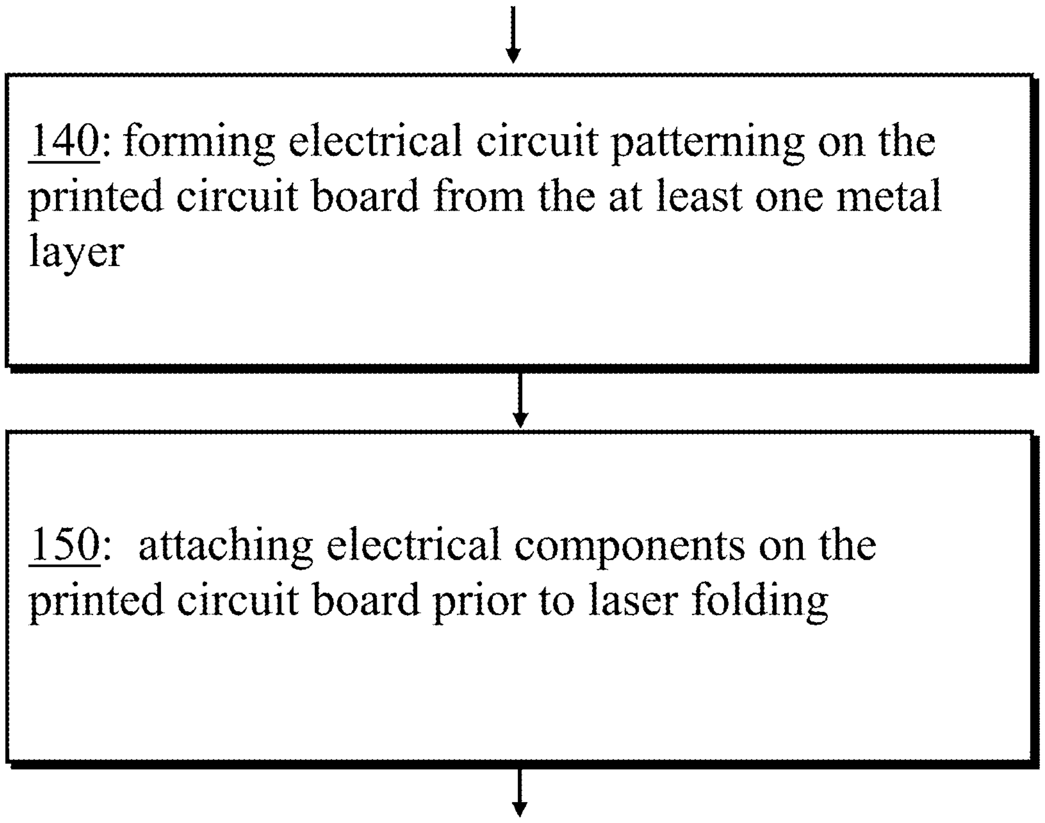
Figure 2B:
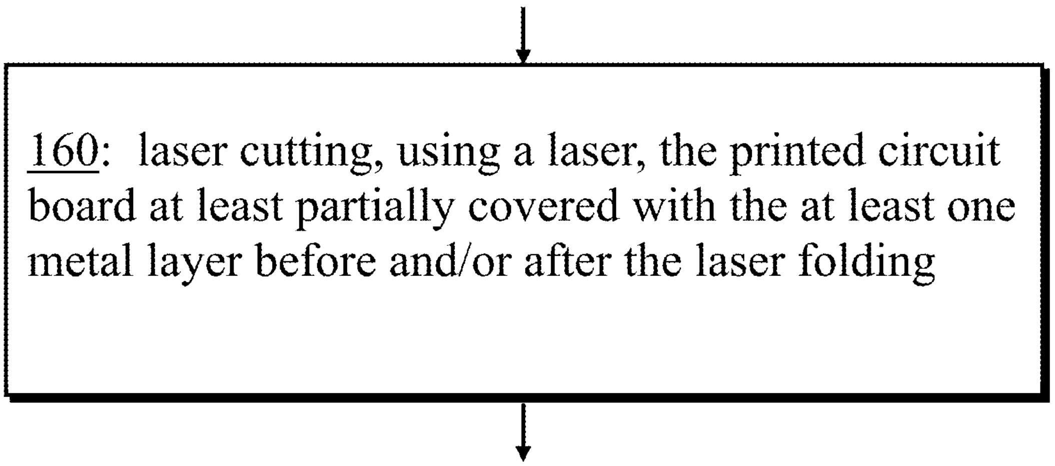
Figure 6:
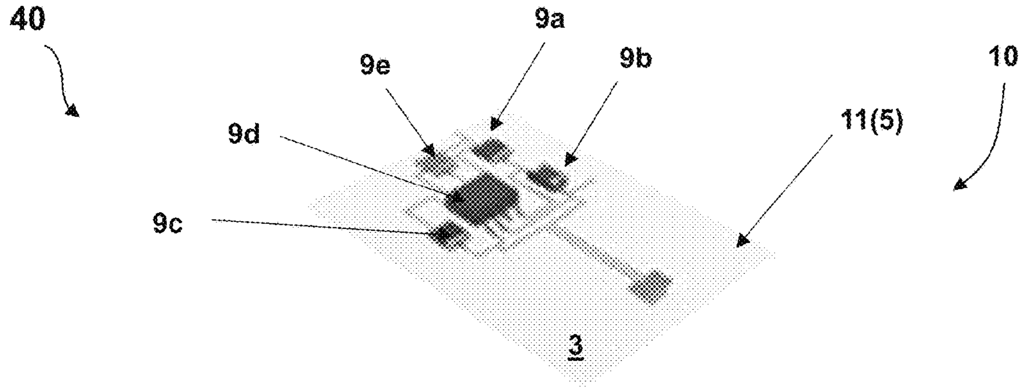
FIG. 6 shows an example of a circuit board comprised of a PCB having multiple electronic components mounted thereon and connected by at least one circuit path.

FIGS. 2A and 2B show additional steps of method 100 which may be provided for in some embodiments. FIG. 2A shows steps 140: forming electrical circuit patterning on the printed circuit board from the at least one metal layer prior to laser folding, and 150: attaching electrical components on the printed circuit board prior to laser folding. For the former step 140, conventional technologies can be used to define the circuit paths. Flex PCBs are easily patterned by lithography and integrated with pick-and-place machinery. Although, we believe that the patterning of the metal layer can also be accomplished with a laser in some embodiments, meaning blank PCBs can be placed into a single laser unit where the circuits are patterned by the laser, areas cut out from the sheet and laser self-folded. Careful control of the chemical environment may also allow laser patterning of semiconductors (such as CuS, ZnS and $Co_2P$) as well. The latter step 150 can include using solder, conductive epoxy or other means to attach either a packaged integrated circuit (IC) or electrical passive. Electronic components, like resistors, capacitors, and diodes, can be mounted on the PCB. Chips and ICs can be mounted using conventional means (e.g., flip-chip, gold bump, etc). FIG. 6 shows an example of a circuit board 40 comprised of PCB 10 having multiple electronic components (9*a*, 9*b*, 9*c*, 9*d*, 9*e*) mounted thereon and connected by at least one circuit path 11 formed by the at least one metal layer 5.

FIG. 2B shows step 160: laser cutting, using the laser, the printed circuit board at least partially covered with the at least one metal layer before and/or after the laser folding. The laser is operated at a high intensity sufficient to cut through the electrically insulating material (e.g., polymer) 3 and the at least one metal layer 5. This enables cutting of a PCB into arbitrary shapes. Surface cutting is achievable for depths of approximately 100 μm for many conventional PCB materials. This provides for PCB thickness of up to about 200 μm assuming cutting from both sides. Careful control, however, of the laser settings should allow enough heat to enter the top of at least metal layer 5 (e.g., copper) without cutting through it, enabling laser forming of thin metal traces despite the high reflectivity.

Figure 7:
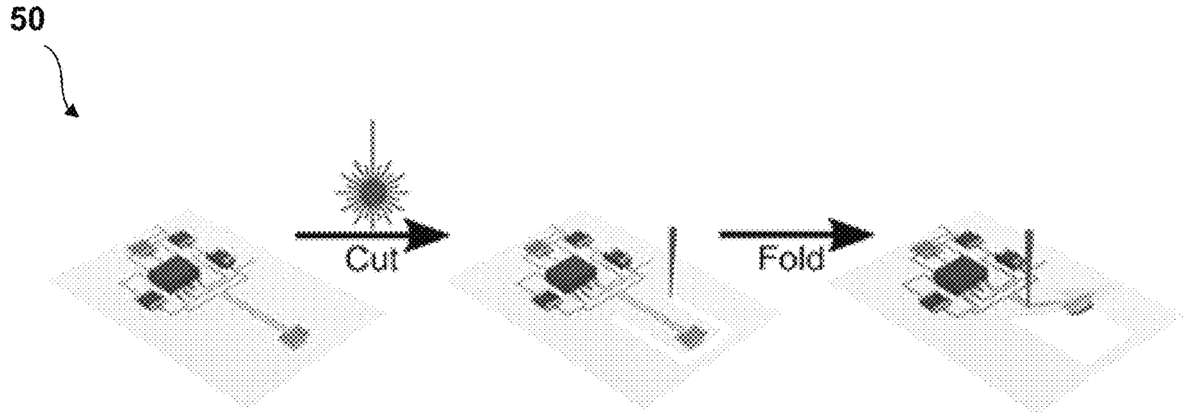
FIG. 7 shows an exemplary sequence of cutting and folding steps.

In some embodiments and implementations, the same laser can be used to both cut and fold the PCB 10. Laser settings are tuned to select between cutting and folding with higher power resulting in cutting and lower power resulting in localized heating for folding into 3D shapes. FIG. 7 shows an exemplary sequence 50 of cutting and folding steps.

Figure 8A:
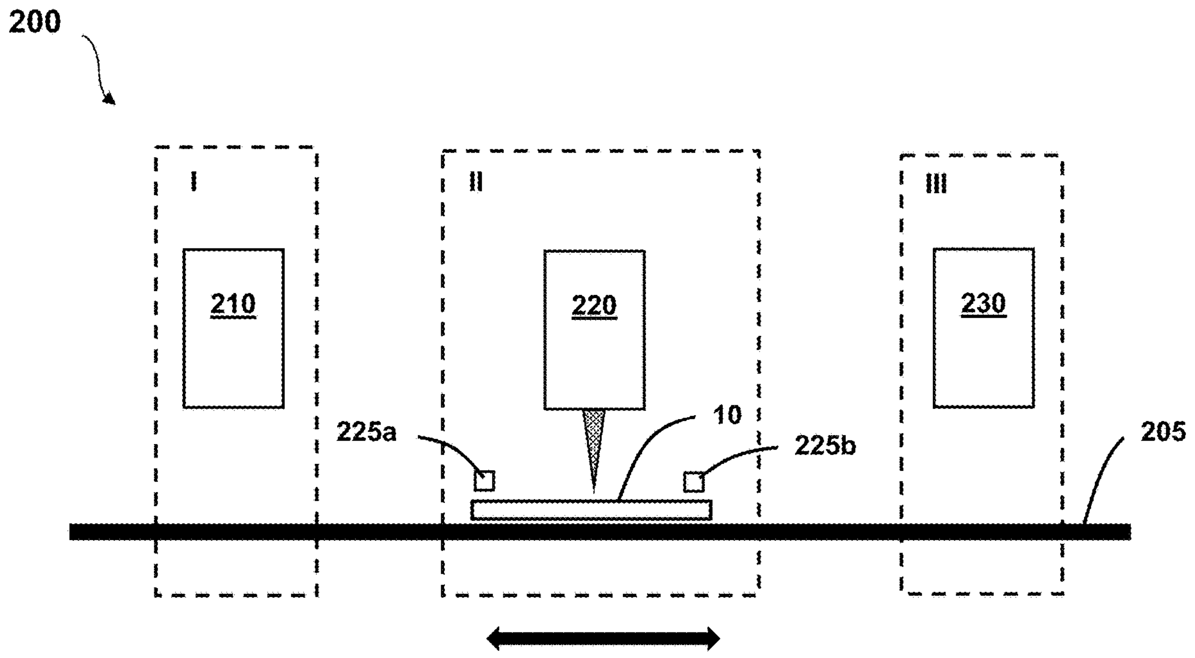
FIGS. 8A and 8B illustrate exemplary laser forming apparatuses for forming three-dimensional electronic devices from 2D material according to embodiments.

FIG. 8A illustrates an exemplary laser forming apparatus 200 for forming three-dimensional electronic devices from 2D material according to embodiments. It can be configured to execute various embodiments of method 100. The apparatus 200 provides for rapid and semi-autonomous, if not fully autonomous, laser forming of a PCB 10 (comprised of an electrically insulating material 3 at least partially covered with at least one metal layer 5; see, e.g., FIGS. 3A and 3B). The workpiece, PCB 10, is moved through multiple workzones I, II and III. The movement of the PCB 10 is accomplished by a conveyor 205. This can be a simple belt system or a complex mover. Preferably, the conveyor 205 allows for motion back and forth.

The first workzone I is where one or more processing steps are executed prior to laser forming. These processing steps may include forming electrical circuit patterning on the printed circuit board from the at least one metal, and/or attaching or forming electrical components on the printed circuit board prior to laser folding. Thus, workzone I may include processing equipment 210 used for forming electrical circuit patterns and/or attaching or forming electrical components. Equipment 210 can include conventional laser or lithographic means used for circuit patterning. Likewise, it can include traditional pick-and-place apparatus for chip or IC mounting configured to conventional chip mounting, like flip-chip, gold bump, etc.

The second workzone II is for laser forming primarily. Processing equipment 220 includes at least one laser provided for performing at least the following steps: (i) reducing the reflectivity of the surface of the at least one metal layer 5, (ii) cutting the PCB 10, and (iii) laser folding the PCB 10. To these ends, processing equipment 220 may comprise one or more lasers configured for these tasks. We have found they can be accomplished using at least a high power laser and a low power laser. More preferably, though, a single laser may be adventurously provided which is selectively controlled to perform each of these steps in different modes. As an example, we used a 20 W, pulsed (f=20 kHz) Full Spectrum Lasers MC Series fiber laser (λ=1064 nm) with an 80 μm spot size. It can be operated in both low- and high-power modes. Table I, below, gives some exemplary laser parameters whether a single laser is, or separate lasers are, provided for in processing equipment 220.

TABLE I

Exemplary Laser Parameters

| Operation | Laser Type or Mode | Power | Power Level (based on 20 W laser) | Scanning Speed | Passes |
|---|---|---|---|---|---|
| Surface Oxidizing/ Roughening | High Power | 16 W | 80% | 100 mm/s | Single |
| Laser Folding | Low Power | 6 W | 30% | 100 mm/s-TGM | Multiple based on fold angle |
| Cutting | High Power | 20 W | 100% | 100 mm/s | Single |

The at least one laser of processing equipment 220 is preferably moveable. The laser(s) may be configured to move, individually or together, in the three primary translational directions (i.e., X-, Y- and Z-axes). One or more additional degrees of freedoms (such as rotation motion about one of more of the primary axes, e.g., pitch, roll and yaw) could also be provided, up to, and possibly exceeding, 6 DOFs.

To ensure accurate registration and flatness in at least workzone II for the above processing, clamping fixtures 225*a* and 225*b* may be provided for clamping and securing the PCB 10 during processing. One or more sides of the PCB 10 can be clamped by the fixture 225*a* and 225*b*. They can each be simple manually operated clamp, such as two 3D printed pieces that screw down onto the stage to clamp the piece flat. For our fabrications, we clamped the PCB on all its sides. In other embodiments, hydraulic or pneumatic clamps may be preferably used to provide fully automated clamping and allow for more rapid sequence through the apparatus.

The third workzone III is for post-laser forming processing with processing equipment 230. Final assembly of the device may be performed here. For instance, equipment 230 may include a 3D printer or other additive manufacturing device for final assembly. Any additional circuit patterning or chip placement can be provided for by equipment 230. For example, connection to power sources can be made through fixed connections or by adding batteries. Processing equipment 230 may also include measurement device(s) that provide for quality assurance (QA)/quality control (QC) testing to evaluate the 3D electrical devices thus made. These can include a multimeter or voltmeter. Non-conforming 3D electronic devices can be identified and separately removed from the apparatus 200 from conforming ones.

In some embodiments, any of workzones I, II and III may be further provided with a laser that is configured to use laser ablation propulsion to assist in assembly of 3D electronic devices as disclosed in U.S. patent application Ser. No. 16/662,951 titled "Method and apparatus for performing contactless laser fabrication and propulsion of freely moving structures," herein incorporated by reference in its entirely.

Figure 8B:
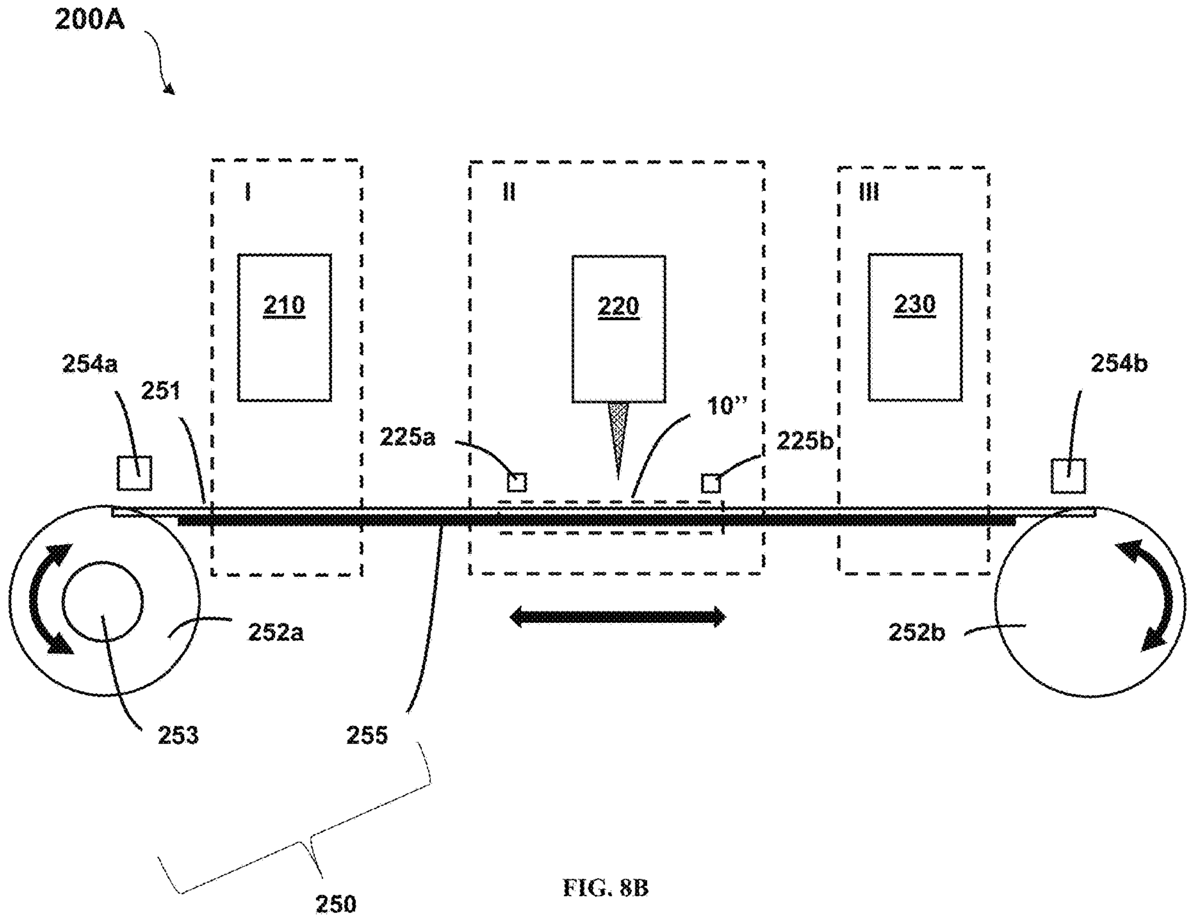

FIG. 8B illustrates another exemplary laser forming apparatus 200A for forming three-dimensional electronic devices from 2D material according to embodiments. It is configured for processing flexible PCB 10" (comprised of an electrically insulating material 3 at least partially covered with at least one metal layer 5). Many of the parts of apparatus 200A are similar to those of apparatus 200 are thus will not be redescribed.

Additionally, it includes a reel-to-reel device 250 allowing repeated manufacturing of self-folded parts from flexible PCB substrate (sheet stock) 251 as it is moved from a supply reel to a take-up reel. Reel 252*a* (supply or play-out reel) supplies flexible substrate 251, which will ultimately include PCBs 10", through the various manufacturing workzones I, II and III. One or both of reels 252*a*, 252*b* may be driven by a suitable motor 253 (one of which is shown on the supply reel 252*a* in the figure) to pull the flexible substrate 251 through the manufacturing workzones I, II and III. Motor 253 can be for example various DC or AC motors for driving the reel 252*a*, such as a brushless DC motor, a high-resolution stepper motor, a high-resolution servo motor, or the like. Finished 3D electronic devices can be removed from the apparatus after workzone III. An optional take-up reel 252*b* can receive the remaining unused flexible substrate 251.

Guides 254*a* and 254*b* keep the flexible substrate 251 flat in the manufacturing workzones I, II and III. The guides 254*a*, 254*b* can have a through slot through which the substrate 251 arrives, and slot to both sides. They can be formed of and/or coated with a lubricious polymer such as polytetrafluoroethylene or the line. In embodiments, there may be a through slot through which the remaining unused flexible substrate 251 leaves the manufacturing workzone III and is taken up by the second reel 252*b* (take-up reel). A platen 255 may further support the flexible PCB substrate 251.

In the manufacturing process, the flexible substrate 251 is transferred between the two reels 252*a*, 252*b* through the guides 254*a*, 254*b*, which sets the height. In the second manufacturing workzone, the at least one laser 220 (above, not shown) is used to cut and fold 3D components. A roll-to-roll apparatus configured for rapidly creating 3D parts is an important feature allowing laser forming to be done at a large scale.

EXAMPLES

To demonstrate our novel method 100 is viable for the rapid prototyping and fabrication of 3D electronics, we fabricate multifold structures with fully functional integrated electronics as well as the facile folding of complex, commercially fabricated flex PCB circuits. They were initially formed from 2D patterned copper on polyimide.

For these fabrications, used a 20 W, pulsed (f=20 kHz) Full Spectrum Lasers MC Series fiber laser (λ=1064 nm) with an 80 μm spot size to successfully cut and fold a copper/polyimide bilayer which is commonly used for making flexible PCBs. Laser power was controlled using pulse-width modulation. More, the same laser can advantageously be used to reduce reflectivity of the copper improve the absorption properties, allowing laser forming without cutting the thin copper layers. Our results demonstrate our new way for the rapid fabrication of 3D electronics.

Example 1: Cube Circuit

First, we laser formed a cube with a functioning electronic circuit. We started with a flex PCB that was patterned by etching a 2 mm wide trace in the middle of the flex PCB, electrically isolating the two halves. Since the thin copper trace is highly reflective, we used a single, high-power laser exposure to oxidize the surface and improve laser absorption prior to laser folding. A surface mount light emitting diode (LED) was soldered to the plates and connected to a circuit containing a resistor and a 9V battery.

Figure 9A:
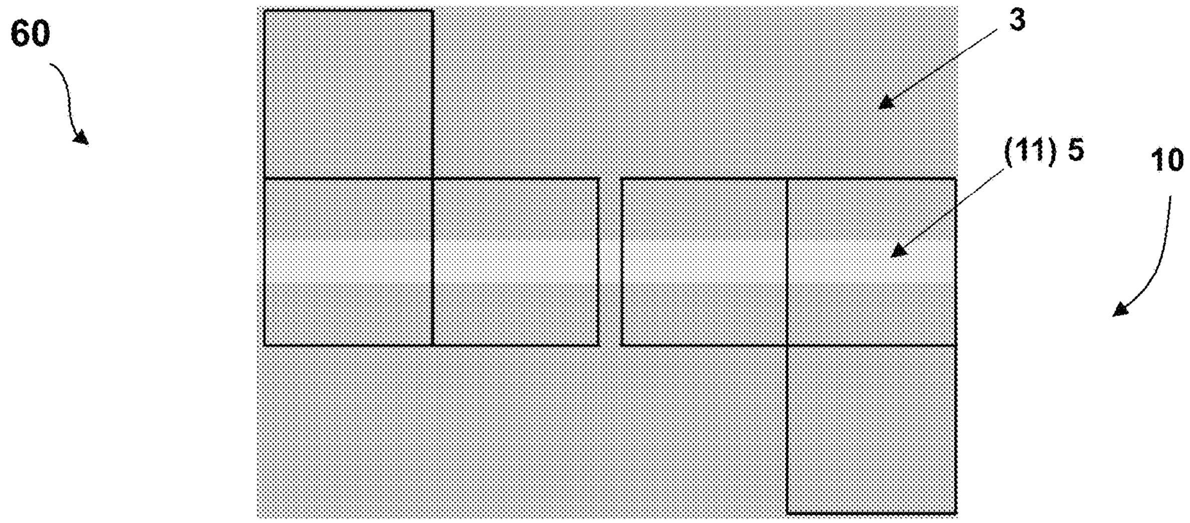
FIGS. 9A-9C show a 3D cube circuit according to an embodiment which we fabricated.
Figure 9B:
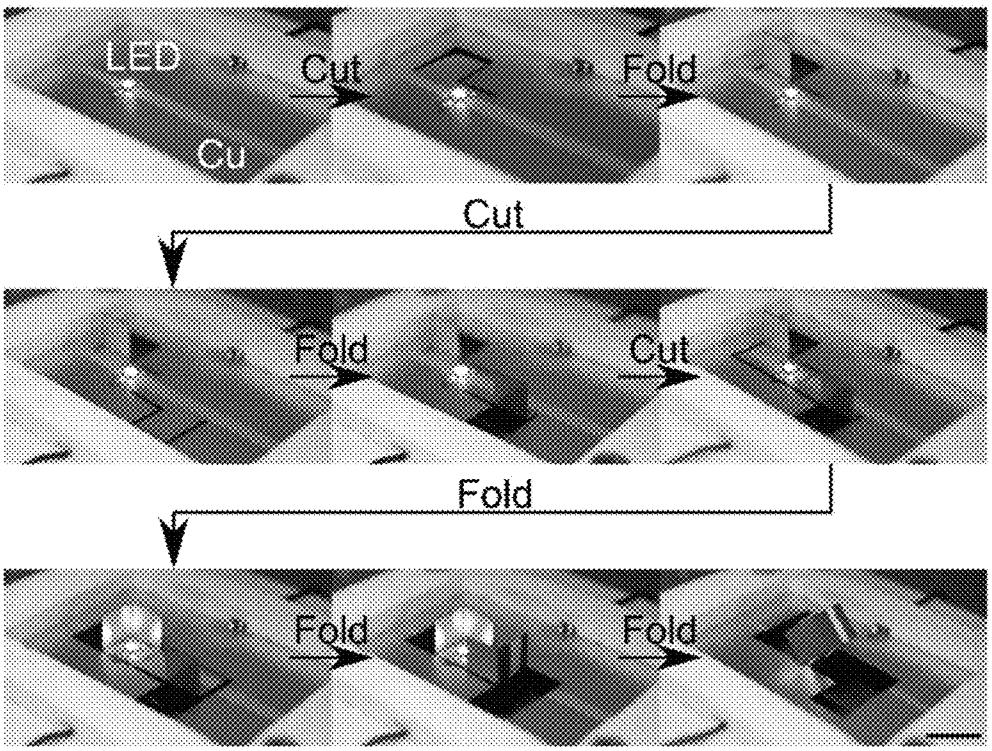
Figure 9C:
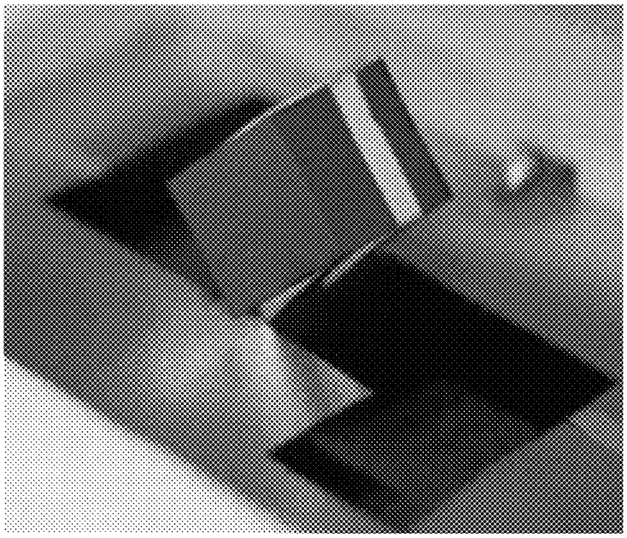

FIG. 9A shows a template 60 to form the cube circuit 70 (FIG. 9C) from a 2D PCB 10. The flat PCB 10 includes electrically insulating material 3, formed here of polyimide, and the metal layer 5, here, a strip of copper forming the trace 11. Six squares are depicted on template 60 which, when folded, will form sides of the cubic circuit. In FIG. 9B, we show step-by-step laser folding of the cube with a functioning electronic circuit. An etching process (not shown) removed the copper from a strip in the middle of the sample. The first frame (top left) shows the LED that bridges across this etched region to make electrical connections with copper on each side. The LED maintains electrical connectivity throughout the cutting and folding process and can be folded out-of-plane. The scale bar is 1 cm. The fiber laser cut through the bilayer to form a Z-shape net as it is laser formable unlike the T-shape nets. A narrow (500 μm) metal bridge between each half of the cube maintained mechanical and electrical connectivity with the flex PCB during the forming process. The exposed polyimide does not contribute to the folding as even the low-power folding passes are able to cut through. (Note: a short video of the entire manufacturing process titled "Laser forming of cube with integrated LED" is included with the online supplementary material of our 2022 *ACS Appl. Mater. Interfaces* paper, noted below). FIG. 9C is a photograph showing the 3D cube circuit 70 after its fabrication.

Example 2: Folded Timer Circuit

We also laser formed a more complex circuit: an astable 555 timer, which comprises multiple surface mount components including an integrated circuit. The astable 555 timer is an oscillator circuit was designed in KiCAD and fabricated by OSH Park. (Note: a circuit schematic of the astable 555 timer is included with the online supplementary material of our 2022 *ACS Appl. Mater. Interfaces* paper, noted below).

A standard trace width of 0.4 mm was used for the circuit paths, but a trace width of 2.5 mm was used for the folding region to make manual alignment easier. The 555-timer circuit was designed to have a frequency of 2 Hz with all surface mount components bought from Digi-Key. The circuits were cut out from the board using the laser writer before soldering all surface mount components. Electrical connectivity was tested by connecting a 9V battery to the circuit and confirming the LED was blinking properly before, during, and after laser forming. The blinking pattern of the LED allows easy verification of electrical connection during folding of the commercial PCB.

Figure 10:
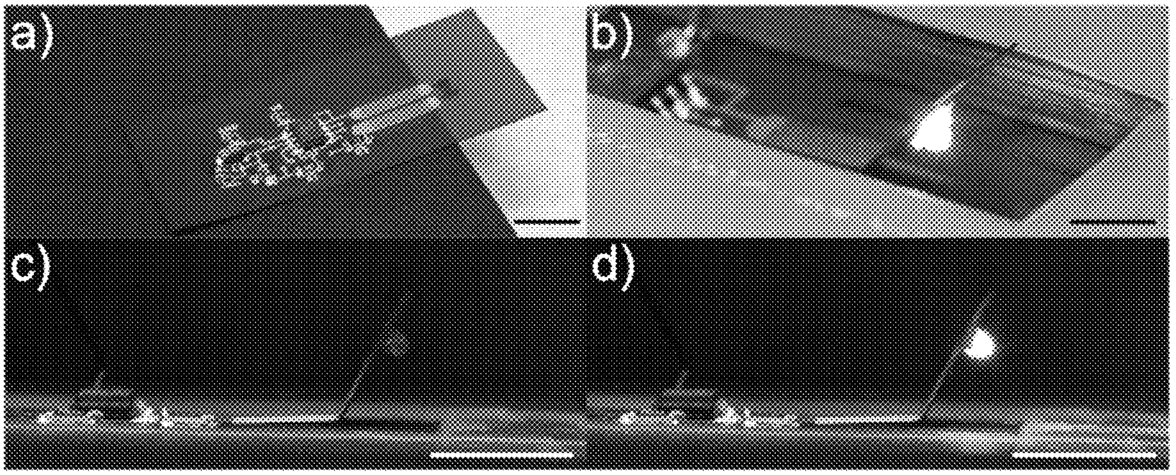
FIG. 10 includes photographs (a)-(d) showing steps in the laser forming a 3D timer circuit according to an embodiment which we fabricated.

FIG. 10 includes photographs (a)-(d) showing steps in the laser forming the astable 555 timer circuit. All scale bars are 1 cm. Here, the commercially available flex PCB was populated with surface mount components before being mounted into the laser fabrication apparatus system. The populated board (photo (a) in FIG. 10) is then clamped at the focal plane of the laser before high power laser passes were used to cut a tab around the LED to be folded. The folding pass settings are then used to fold the LED out of plane (photo (b) in FIG. 10) while maintaining electrical connectivity. After laser forming, the sample can be removed from the clamp and retains its fold while the LED still blinks (photos (c) and (d) in FIG. 10). The trace width for the folding region is much larger than in conventional PCBs to make manual alignment easier. Previous reports of laser forming of silicon microstructures suggest that this line width is not an inherent limitation of the process and with automatic alignment systems, conventional trace widths can be used. Note: a short video of the entire manufacturing process titled "Functioning 555-timer after laser forming with LED blinking" is included with the online supplementary material of our 2022 *ACS Appl. Mater. Interfaces* paper, noted below).

We believe these examples to be the first demonstrations of laser forming a 2D polymer/metal multilayer structure into a 3D electronic device in which laser folding of the metal layer causes folding of the polymer layer and thus the entire structure. More, we have demonstrated a laser forming of working 2D electronic circuits to yield three-dimensional electronics. That means that circuit patterning and electronics can be mounted on the 2D PCB prior to laser folding that circuit into a 3D device all the time maintaining electrical connectivity. Preferably, our fabrication methodology advantageously allows for use a low-cost commercial laser to both cut and fold PCBs. Laser settings can be tuned to select between cutting and folding with higher power resulting in cutting and lower power resulting in localized heating for laser folding into 3D shapes. The same laser may also be used for other steps, like reducing the reflectivity of the at least one metal layer to the impinging laser light. This technology enables forming complex, 3D multifold structures with integrated electronics. Laser forming adds a third dimension to printed circuit boards to enable the rapid prototyping and fabrication of complex 3D electronics from 2D substrates.

Aspects of this invention have been previously disclosed by the inventors as follows:

Adam L. Bachmann, Brendan Hanrahan, Michael D. Dickey, and Nathan Lazarus, Presentation titled "Self-folding PCB Origami: Rapid Prototyping of 3D Electronics via Laser Forming," given at the North Carolina State University Engineering Department's Graduate Research Symposium on Tuesday, Sep. 28, 2021; and Adam L. Bachmann, Brendan Hanrahan, Michael D. Dickey, and Nathan Lazarus, "Self-Folding PCB Kirigami: Rapid Prototyping of 3D Electronics via Laser Cutting and Forming," *ACS Appl. Mater. Interfaces* 2022, 14, 12, 14774-14782 (Publication Date: Mar. 17, 2022), available at: https://pubs.acs.org/doi/10.1021/acsami.2c01027 (includes supplemental material).

The presentation and paper are herein incorporated by reference in their entirety for all purposes.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventors, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. A method of forming a three-dimensional electronic device comprising:

laser folding, using only a laser, a two-dimensional electrically insulating printed circuit board at least partially covered with at least one metal layer, the laser impinging upon the at least one metal layer to make one or more folds of the printed circuit board to form a three-dimensional electronic device structure.

2. The method of claim 1, wherein the printed circuit board comprises electrical circuit patterning and/or electrical circuit components thereon.

3. The method of claim 1, wherein the at least one metal layer extends substantially over a surface of the printed circuit board in a region it is to be folded.

4. The method of claim 1, wherein the printed circuit board comprises a polymer, plastic, rubber, ceramic, or fiberglass.

5. The method of claim 4, wherein the polymer comprises polyimide, polyester, polyethylene naphthalate, polytetrafluoroethylene, aramid, or epoxy.

6. The method of claim 1, wherein the at least one metal layer comprises copper, aluminum, nickel, gold, or silver.

7. The method of claim 1, further comprising: laser cutting, using the laser, the printed circuit board at least partially covered with the at least one metal layer before and/or after the laser folding.

8. The method of claim 1, further comprising: reducing the reflectivity of the surface of the at least one metal layer to the laser light for folding.

9. The method of claim 8, where reducing the reflectivity comprises: applying a coating to the surface of the at least one metal layer to reduce the reflectivity of the laser light for folding.

10. The method of claim 9, wherein the coating comprises a graphite or electroless nickel immersion gold (ENIG) coating.

11. The method of claim 8, wherein no light absorbing coating is applied or required.

12. The method of claim 8, wherein reducing the reflectivity comprises: oxidizing the surface of the metal layer, using the laser, before the laser folding to reduce the reflectivity of the laser light for laser folding.

13. The method of claim 8, wherein reducing the reflectivity comprises: laser roughening, using the laser, the surface of the at least one metal layer to reduce the reflectivity of the laser light for laser folding.

14. The method of claim 1, wherein the laser folding comprises: using the laser to execute one or more upward folds via a temperature gradient mechanism of the printed circuit board and/or one or more downward folds via a buckling mechanism of the printed circuit board.

15. The method of claim 1, further comprising: forming electrical circuit patterning on the printed circuit board from the at least one metal layer prior to laser folding.

16. The method of claim 1, further comprising: attaching or forming electrical components on the printed circuit board prior to laser folding.

17. The method of claim 1, further comprising:

clamping the two-dimensional electrically insulating printed circuit board at least partially covered with the at least one metal layer prior to laser folding.

18. A method of laser forming a three-dimensional electronic device comprising:

providing a two-dimensional electrically insulating printed circuit board at least partially covered with at least one metal layer;

reducing the reflectivity of the surface of the at least one metal layer to the laser light for laser folding; and laser folding, using only a laser, the two-dimensional printed circuit board at least partially covered with the at least one metal layer, the laser impinging upon the at least one metal layer to make one or more folds of the printed circuit board to form a three-dimensional electronic device structure.

19. An apparatus for forming a three-dimensional electronic device comprising:

a clamp fixture to secure a two-dimensional electrically insulating printed circuit board at least partially covered with at least one metal layer; and at least one laser configured to:

(i) reduce the reflectivity of the surface of the at least one metal layer to reduce the reflectivity of the laser light for laser folding;

(ii) laser cut fold a two-dimensional printed circuit board at least partially covered with the at least one metal layer; and (iii) laser fold the two-dimensional printed circuit board at least partially covered with the at least one metal layer, the laser impinging upon the at least one metal layer to form a three-dimensional electronic device structure.

20. The apparatus of claim 19, wherein the at least one laser comprises a single laser which can operate in different power modes for performing steps (i), (ii) and (iii).

21. The apparatus of claim 19, further comprising equipment configured to: (iv) form electrical circuit patterning on the printed circuit board from the at least one metal layer prior to laser folding, and/or (v) attach electrical components on the printed circuit board prior to laser folding.

* * * * *